(12) United States Patent
Ecklund et al.

(10) Patent No.: US 6,577,851 B1
(45) Date of Patent: Jun. 10, 2003

(54) IMPULSE NOISE BLANKER

(75) Inventors: Lawrence Marvin Ecklund, Wheaton, IL (US); Gregory J. Buchwald, Crystal Lake, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/441,024

(22) Filed: Nov. 16, 1999

(51) Int. Cl.[7] .................................. H04B 1/10
(52) U.S. Cl. ................... 455/223; 455/205; 455/226.2; 455/138; 375/351
(58) Field of Search ............................. 455/142, 205, 455/222, 223, 224, 226.1, 226.2, 226.4, 631, 138, 218, 219, 220, 221, 67.1, 211, 225, 278.1; 375/351

(56) References Cited

U.S. PATENT DOCUMENTS

| | | | | |
|---|---|---|---|---|
| 4,197,501 A | * | 4/1980 | Gammel et al. | 375/334 |
| 4,327,446 A | * | 4/1982 | Dressler | 455/212 |
| 4,334,317 A | * | 6/1982 | Beesley | 455/194.1 |
| 4,479,251 A | * | 10/1984 | Dawson | 455/219 |
| 4,856,084 A | * | 8/1989 | Richards, Jr. | 455/223 |
| 5,537,675 A | * | 7/1996 | Bond | 455/223 |
| 5,794,136 A | * | 8/1998 | Buchwald et al. | 455/334 |
| 5,890,059 A | * | 3/1999 | Shoemaker et al. | 455/297 |
| 6,292,654 B1 | * | 9/2001 | Hessel et al. | 455/223 |
| 6,347,146 B1 | * | 2/2002 | Short et al. | 381/15 |

* cited by examiner

Primary Examiner—Edward F. Urban
Assistant Examiner—Temica M. Davis
(74) Attorney, Agent, or Firm—James L. Clingan, Jr.

(57) ABSTRACT

A radio back-end integrated circuit that includes a blanking switch having a signal input which receives an IF signal, a control input, and a signal output. Also included is a demodulator having an input coupled to the output of the blanking switch, and an output. The radio back-end also has a sample and hold switch having a signal input coupled to the output of the demodulator, a control input, and an output. Combined with the switch is a noise impulse detector having an input coupled to the IF signal and an output coupled to the control inputs of the blanking switch and the sample and hold switch. A sample and hold/de-emphasis circuit has an input coupled to the output of the sample and hold switch, and an output. The sample and hold/de-emphasis circuit has a high input impedance amplifier, a resistor, and only one capacitor.

12 Claims, 8 Drawing Sheets

IMPULSE NOISE BLANKER

RELATED APPLICATIONS

This is related to U.S. patent application Ser. No. 09/441,022, entitled "Feedforward and Feedback Control in Radio," U.S. patent application Ser. No. 09/441,330, entitled "Digitally Controlled Radio Back-End," U.S. patent application Ser. No. 09/440,999, entitled "Noise Reduction and Range Control Radio System," all of which are filed concurrently herewith and are incorporated herein by reference and assigned to the current assignee hereof.

FIELD OF THE INVENTION

The present invention relates generally to radio systems and more particularly to an improved back end for radio signal control.

RELATED ART

Radio systems are known in the art of communications between communication devices. One type of radio receives analog radio signals through an antenna where the analog signals are coupled to a front end of the radio. The front end communicates with back-end circuitry to assist the back-end to convert the received analog signal into audio or data information. The back-end is controlled in part by a micro-processor, micro-controller, or other type of processing circuitry.

As an analog radio signal passes through a communications channel, various signal impairments are introduced into the analog signal and interfere with desired radio outputs. This is true whether the analog radio signal is an amplitude modulated (AM) or frequency modulated (FM) signal. Those skilled in the art recognize the existence of signal impairments and past efforts to remove the impairments have not been completely satisfactory.

Regarding removal of the impairments, the prior art fails to disclose, teach, or otherwise suggest a radio back-end integrated circuit that includes a blanking switch, a demodulator, a sample and hold switch, a noise impulse detector, and a sample and hold/de-emphasis circuit, wherein the sample and hold/de-emphasis circuit includes a high input impedance amplifier, a resistor, and only one capacitor to assist in minimizing the impairments.

Further limitations and disadvantages of conventional and traditional systems will become apparent to one of skill in the art through comparison of such systems with the present invention as set forth in the remainder of the present application with reference to the drawings.

BRIEF DESCRIPTION OF THE DRAWINGS

The present invention is illustrated by way of example and is not limited in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

As used herein, the term "bus" is used to refer to a plurality of signals or conductors which may be used to transfer one or more various types of information, such as data, addresses, control, or status. The terms "assert" and "negate" is used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Figure 1:
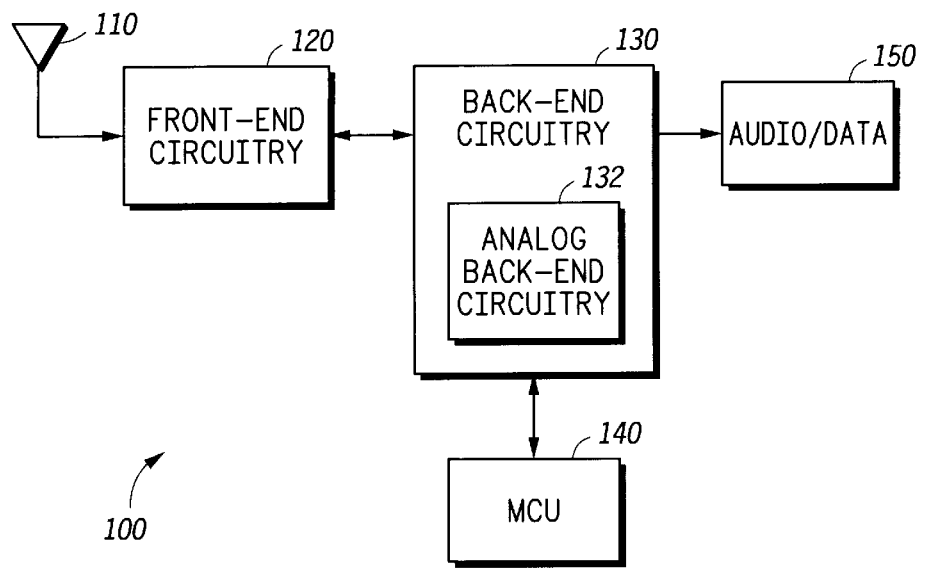
FIG. 1 is a system diagram illustrating one embodiment of a radio built in accordance with principles of the present invention that contains a back-end circuitry having at least analog circuitry.

FIG. 1 is a system diagram illustrating one embodiment of a radio 100 built in accordance with principles of the present invention that contains a back-end circuitry 130 having an analog back-end circuitry 132. The radio 100 includes an antenna 110 that captures radio signals that are transmitted thereto. The antenna 110 passes captured signals to a front-end circuitry 120 where those signals are then prepared for passage to the back-end circuitry 130 for further processing. The back-end circuitry 130 includes, but is not limited to, the analog back-end circuitry 132. A micro-controller (MCU) 140 is included in the radio 100 and communicates with the back-end circuitry 130 to instruct the back-end circuitry 130 regarding desired signal handling processes. After processing in the back-end circuitry 130, audio/data output information 150 is produced. Of course, numerous modifications are possible for the radio 100 and this is only an exemplary embodiment for purposes of describing the present invention.

Figure 2:
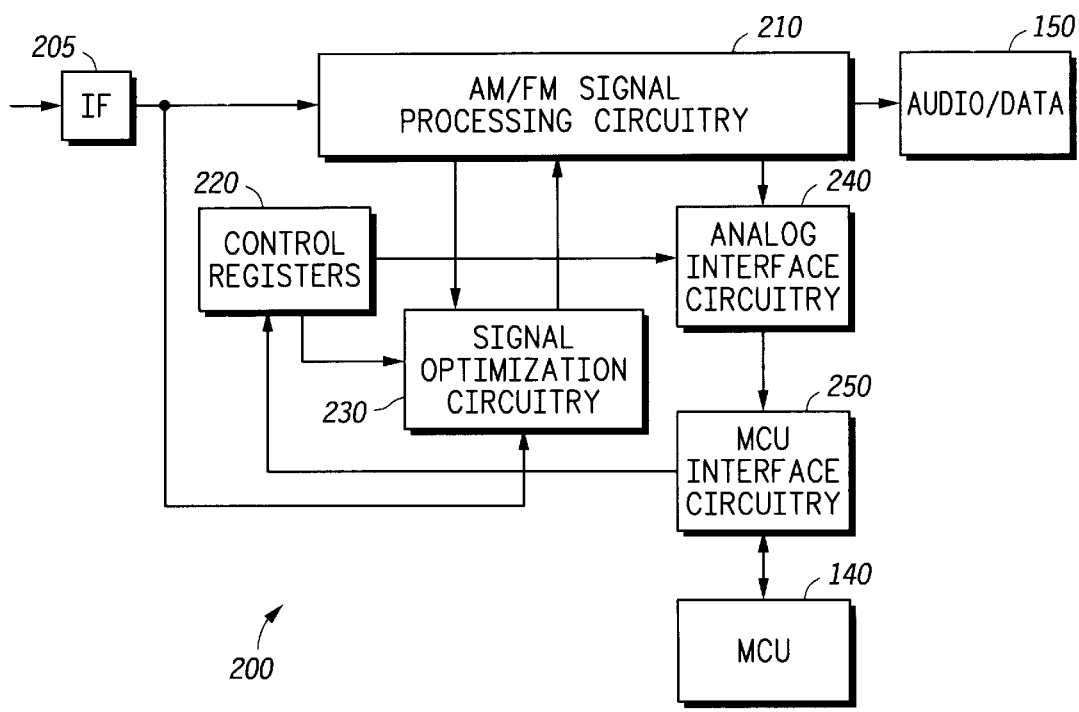
FIG. 2 is a system diagram illustrating one embodiment of a back-end circuitry built in accordance with the radio of FIG. 1.

FIG. 2 is a system diagram illustrating one embodiment of a back-end circuitry 200 built in accordance with the radio of FIG. 1. In certain embodiments of the invention, the back-end circuitry 200 is the back-end circuitry 130 of FIG. 1. The back-end circuitry 200 includes an intermediate frequency (IF) signal 205 which corresponds to the signal received at the antenna 110 after preliminary processing. The IF input signal 205 is connected to an amplitude modulation/frequency modulation (AM/FM) signal processing circuitry 210. Also included in the back-end circuitry 200 is a plurality of control registers 220 for signifying desired operations to be performed on the IF input signal 205 within the AM/FM processing circuit 210. The control registers 220 commonly indicate to a signal optimization circuit 230 and to an analog interface circuit 240 regarding desired actions to be performed on the demodulated IF input signal 205. It should be noted that the IF input signal 205 may communicate directly with the AM/FM signal processing circuitry 210 or with the signal optimization circuitry 230.

A feedforward arrangement is created when the signal optimization circuitry 230 receives communication signals from the AM/FM signal processing circuitry 210 and, in conjunction with the information from the control registers 220, determines appropriate signals to be coupled to the AM/FM signal processing circuitry 210 for combining with the IF input signal 205 before further processing. A feedback arrangement is created as the IF input signal 205 continues transmission and an analog interface circuitry 240 acquires information regarding the signal. In conjunction with the instructions contained in the control registers 220, the analog interface circuit 240 passes information to a microcontroller (MCU) interface circuitry 250 that interacts with the MCU 140. The MCU 140 determines appropriate adjustments that can be made to the IF input signal 205 and feeds the information back through the MCU interface circuitry 250, to the control registers 220, back through the signal optimization circuitry 230, and finally to the AM/FM signal processing circuitry 210 to complete the feedback loop in the back-end circuitry 200. In this manner, the IF input signal 205 may receive digitally and analog controlled feedforward and feedback adjustment before finally being transmitted as a plurality of audio/data output information 150. In certain embodiments of the invention, the plurality of audio/data output information 150 of FIG. 2 is the plurality of audio/data output information 150 of FIG. 1.

Figure 3:
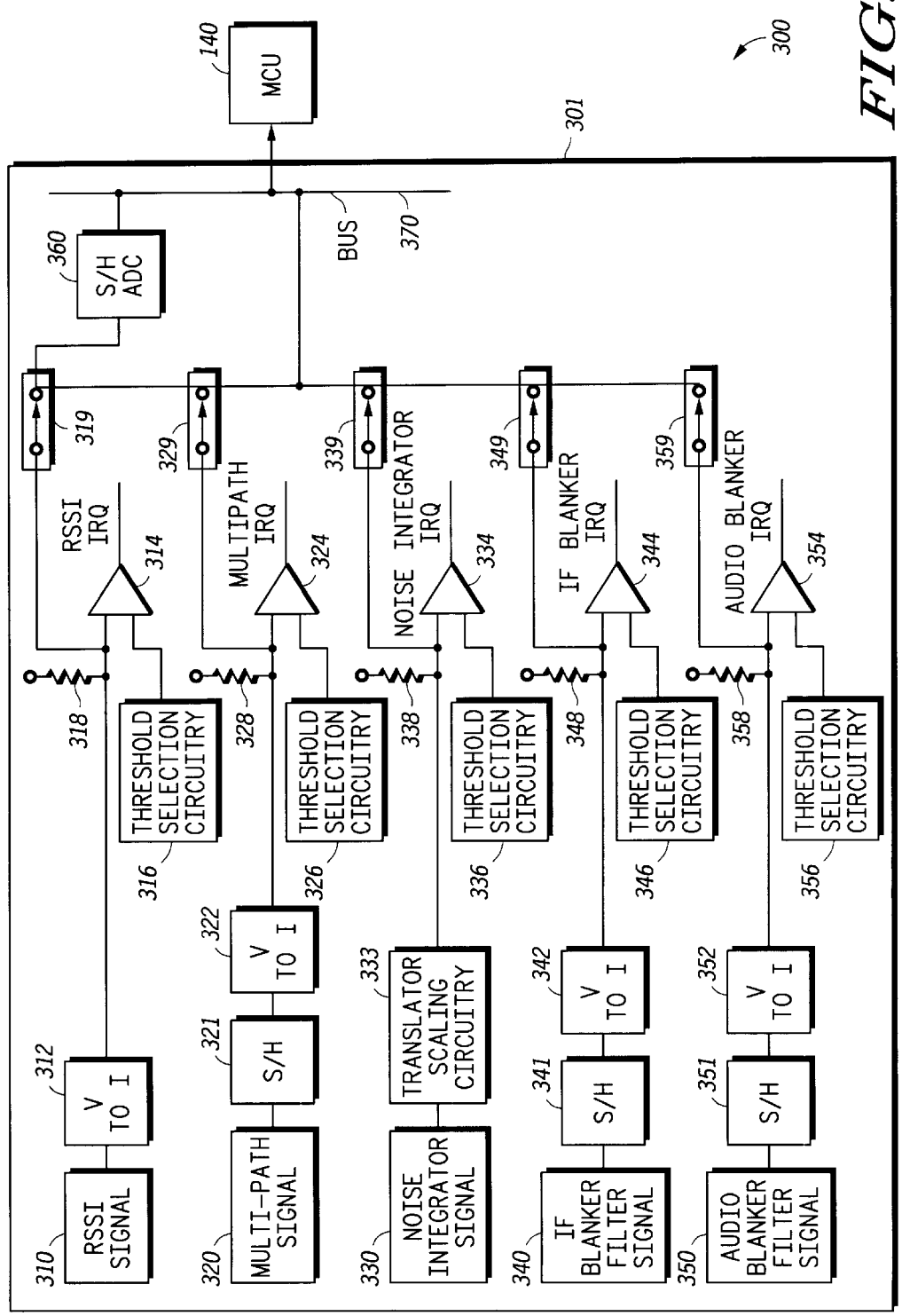
FIG. 3 is a system diagram illustrating one specific embodiment of an analog interface circuitry built in accordance with FIG. 2.

FIG. 3 is a system diagram 300 illustrating one specific embodiment of an analog interface circuitry 301 built in accordance with FIG. 2. In certain embodiments of the invention, the analog interface circuitry 301 is the analog interface circuitry 240 of FIG. 2. The analog interface circuitry 301 is typically configured to receive a number of different signals. For example, it may receive a relative signal strength indication (RSSI) signal 310, a multi-path signal 320, a noise integrator signal 330, an intermediate frequency (IF) blanker filter signal 340, an audio blanker filter signal 350, or other signals which are deemed appropriate for the purposes of the present invention.

The RSSI signal 310 is commonly coupled to voltage to current (V to I) conversion circuit 312 before being coupled to a comparator 314.

A threshold selection circuitry 316 supplies the second input signal to the comparator 314 and enables the comparator 314 to produce an RSSI interrupt request (IRQ) signal for further passage to the MCU 140. It should be noted that a pull-up resistor 318 and a switch 319 are included in the circuitry to enable an analog-to-digital converter (ADC) circuit 360 to perform a sample and hold operation on the RSSI signal 310.

The multi-path signal 320 is coupled to a sample and hold circuit 321 prior to being coupled to a voltage to current (V to I) conversion circuit 322 and then to a comparator 324. Similar to the RSSI signal 310, the multi-path signal 320 is compared to a signal generated by a threshold selection circuit 326 wherein the comparator 324 is enabled to produce a multi-path interrupt request (IRQ) signal for further passage to the MCU 140. In addition, a pull-up resistor 328 and switch 329 are included in the circuit to enable the ADC circuitry 360 to perform a sample and hold operation on the multi-path signal 320.

The noise integrator signal 330 is coupled to a translator/scaling circuit 333 before being coupled to a comparator 334. A threshold selection circuit 336 generates a signal to which the noise integrator signal 330 is compared in the comparator 334 to enable the comparator 334 to pass a noise integrator IRQ to the MCU 140. A pull-up resistor 338 and a switch 339 are also included for the ADC circuitry 360 to select or to perform a sample and hold operation on the noise integrator signal 330.

The intermediate frequency (IF) blanker filter signal 340 is coupled to sample and hold circuitry 341 before being coupled to a voltage to current (V to I) conversion circuit 342 and to a comparator 344. Similar to the RSSI signal 310, the multi-path signal 320, and the noise integrator signal 330, the IF blanker filter signal 340 is compared to a signal that is produced by a threshold selection circuit 346 wherein the comparator 344 is enabled to produce an IF blanker IRQ signal for further passage to the MCU 140. A pull-up resistor 348 and a switch 349 are available for the ADC circuitry 360 to select and to perform a sample and hold operation on the IF blanker filter signal 340.

The audio blanker filter signal 350 is coupled to a sample and hold circuit 351 and to a voltage to current (V to I) conversion circuit 352 before being coupled to a comparator 354. A threshold selection circuit 356 generates a signal for the comparator 354 to use in its compare function to produce an audio blanker IRQ for passage to the MCU 140. A pull-up resistor 358 and a switch 359 are included for use by the ADC circuitry 360 to select and to perform a sample and hold operation on the audio blanker filter signal 350.

The ADC circuitry 360 performs a sample and hold operation on one of the signal impairment criteria, i.e., the RSSI signal 310, the multi-path signal 320, the noise integrator signal 330, the IF blanker filter signal 340, and the audio blanker filter signal 350. The signals provided by the comparator 314, the comparator 324, the comparator 334, the comparator 344, and the comparator 354, are coupled to the MCU 140 where the appropriate signal selection is determined for the ADC circuitry 360. The MCU 140 communicates across the bus 370 to interact with the ADC circuitry 360 and the switches 319, 329, 339, 349, and 359.

Figure 4:
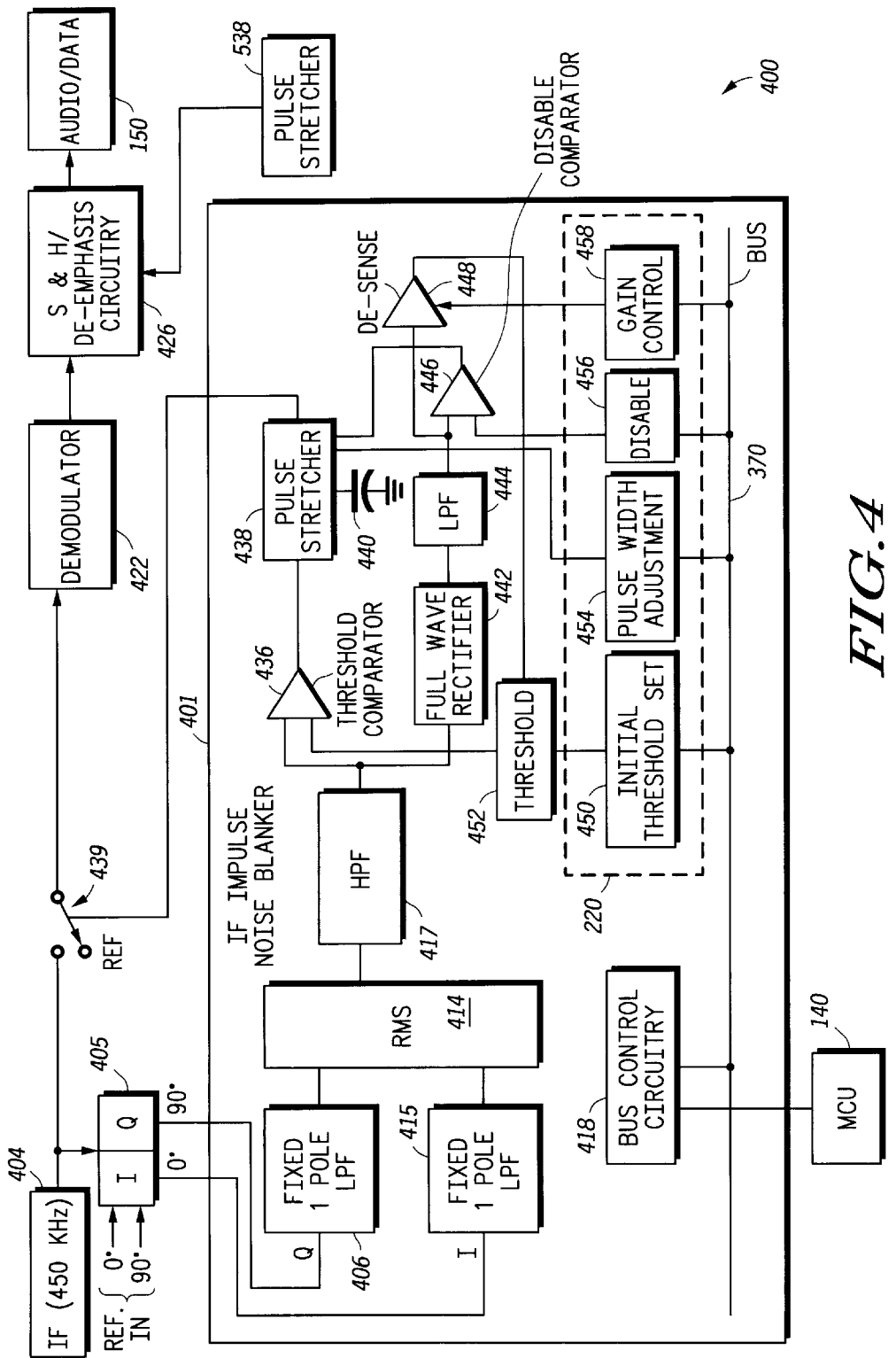
FIG. 4 is a system diagram illustrating one specific embodiment of a signal optimization circuitry built in accordance with FIG. 2 that contains an intermediate frequency impulse noise blanker.

FIG. 4 is a system diagram illustrating one specific embodiment of a signal optimization circuitry 400 built in accordance with FIG. 2 that contains an intermediate frequency (IF) impulse noise blanker 401. In certain embodiments of the invention, the signal optimization circuitry 400 is the signal optimization circuitry 230 of FIG. 2. The IF impulse noise blanker 401 receives an intermediate frequency (IF) signal 404 having a fundamental frequency of approximately 450 kHz. This IF signal 404 is partitioned into in-phase and a quadrature base band signals 405, the two signals being demodulated with a 90° phase offset. The quadrature portion of the IF signal 404 is coupled into a fixed, single pole low pass filter 406 before being transmitted to a root mean square (RMS) circuit 414. The in-phase portion of the IF signal 404 is coupled into a separate fixed single pole low pass filter 415 before being coupled into the RMS circuit 414. At this stage, the in-phase and quadrature portions of the IF signal 404 are configured to be represented by $\sqrt{I^2+Q^2}$ before being coupled into a high pass filter (HPF) 417.

The HPF 417 passes the demodulated IF signal to a threshold comparator 436 and a full wave rectifier 442. In the threshold comparator 436, the demodulated base-band IF signal 404 is compared to a signal transmitted from a threshold 452 which is set by an initial threshold set 450. The initial threshold set 450 is controlled through bus control circuitry 418 via the MCU 140 and the bus 370. The output of the threshold comparator 436 is coupled to a pulse stretcher 438. The pulse stretcher 438 operates according to a pulse width adjustment 454 that is controlled via the bus control circuitry 418 across the bus 370. Of course, the bus control circuitry 418 is given instructions through the MCU 140.

The full wave rectifier 442 feeds its output to a low pass filter (LPF) 444 and into a disable comparator 446 as well as a de-sense circuit 448. The disable comparator 446 compares the output of the LPF 444 to the output of a disable indicator 456 which is controlled via the bus 370 and disables the circuit if the threshold is exceeded. The pulse stretcher 438 receives the output of the disable comparator 446 as well as the output of the pulse width adjustment circuitry 454, and a capacitor 440. The output of the de-sense circuit 448 is coupled to the threshold 452 to modify the instructions from the initial threshold set 450 as that output passes to the threshold comparator 436. The de-sense circuit 448 is influenced by a gain control 458 that is adjusted according to signals received from the bus 370 ultimately as a result of instructions from the MCU 140.

The IF 404 is coupled to a demodulator 422 when switch 439 is appropriately engaged by the pulse stretcher circuit 438. When the pulse stretcher circuit 438 is active, the input to demodulator 422 is connected to a fixed reference as opposed to the IF signal 404. The output of the demodulator 422 is coupled to a sample and hold/de-emphasis circuitry 426 where a pulse stretcher 538 (FIG. 5) instructs the sample and hold de-emphasis circuitry 426 to retain the last good signal value prior to engagement of the pulse stretcher. At this point the demodulated IF signal 404 produces the plurality of audio/data output information 150. Of note, the initial threshold set 450, the pulse width adjustment 454, the disable indicator 456, and the gain control 458 comprise the plurality of control registers 220.

Figure 5:
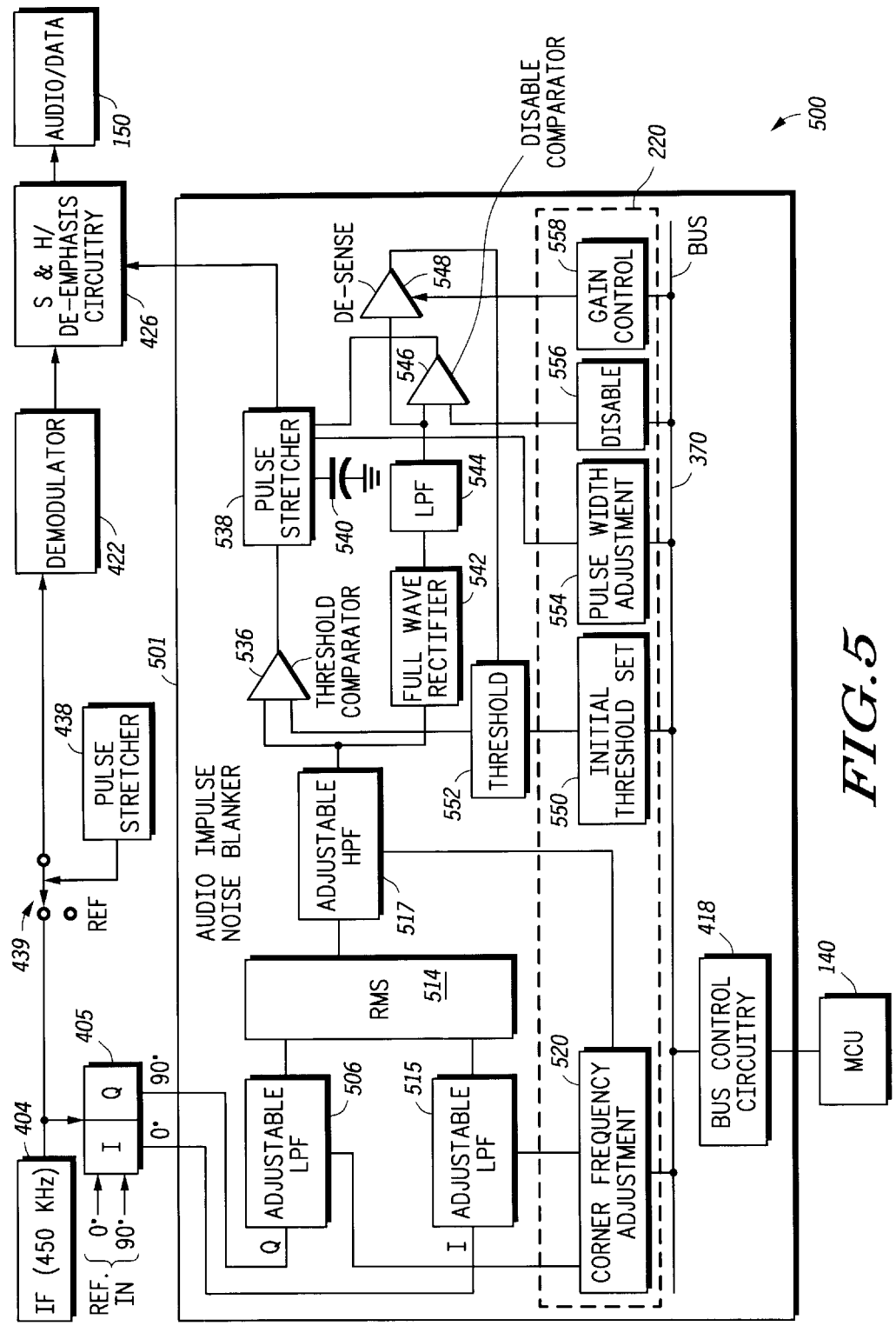
FIG. 5 is a system diagram illustrating one specific embodiment of a signal optimization circuitry built in accordance with FIG. 2 that contains an audio impulse noise blanker.

FIG. 5 is a system diagram illustrating one specific embodiment of a signal optimization circuitry 500 built in accordance with FIG. 2 that contains an audio-impulse noise blanker 501. In certain embodiments of the invention, the signal optimization circuitry 500 is the signal optimization circuitry 230 of FIG. 2. Like the signal optimization circuitry 400, the signal optimization circuitry 500 includes the IF signal 404 having a fundamental frequency of approximately 450 kHz. Again, this IF signal 404 is partitioned into an in-phase signal and a quadrature signal 405, the two signals being demodulated with a 90° phase offset. However, in the audio-impulse noise blanker 500, the in-phase signal is coupled to an adjustable low pass filter (LPF) 515 and the quadrature signal is coupled to an adjustable LPF 506. These LPF's 506, 515 are interchangeable and may be adjusted by a corner frequency adjustment 520. The corner frequency adjustment 520 receives instructions from the bus 370 as indicated by the bus control circuitry 418 and ultimately from the MCU 140. The output of the adjustable LPF's 506 and 515 are coupled to a root mean square (RMS) circuit 514 where they are then coupled to an adjustable high pass filter (HPF) 517. This adjustable HPF 517 receives adjustment commands from the corner frequency adjustment 520 similar to the manner in which the adjustable LPF's 506, 515 receive commands. The output of the adjustable HPF 517 is coupled to both a threshold comparator 536 and a full wave rectifier 542.

In the threshold comparator 536, the demodulated base band IF signal 404 is compared to a signal that is transmitted from a threshold 552 which is set by an initial threshold set 550. The initial threshold set 550 is controlled through bus control circuitry 418 via the MCU 140 and the bus 370. The output of the threshold comparator 536 is coupled to a pulse stretcher 538. The pulse stretcher 538 produces an output according to a capacitor 540, a pulse width adjustment 554, and a disable comparator 546. The output of the pulse stretcher 538 is coupled to a sample and hold/de-emphasis circuitry 426. The disable comparator 546 compares an output of a low pass filter 544 whose input is the output of the full wave rectifier 542. The other input of the comparator 546 is the output from disable indicator 556. As in the IF impulse noise blanker 401, the disable indicator 556 receives signals from the bus 370 as controlled through the bus control circuitry 418 and further as instructed by the MCU 140. The output of the LPF 544 is coupled to both an input of the disable comparator 546 and a de-sense circuit 548. The de-sense circuit 548 is partially controlled by a gain control 558 and its output is coupled back to the threshold 552. Also shown is the pulse stretcher 538 which may produce an output to the IF impulse noise blanker switch 439.

Figure 6:
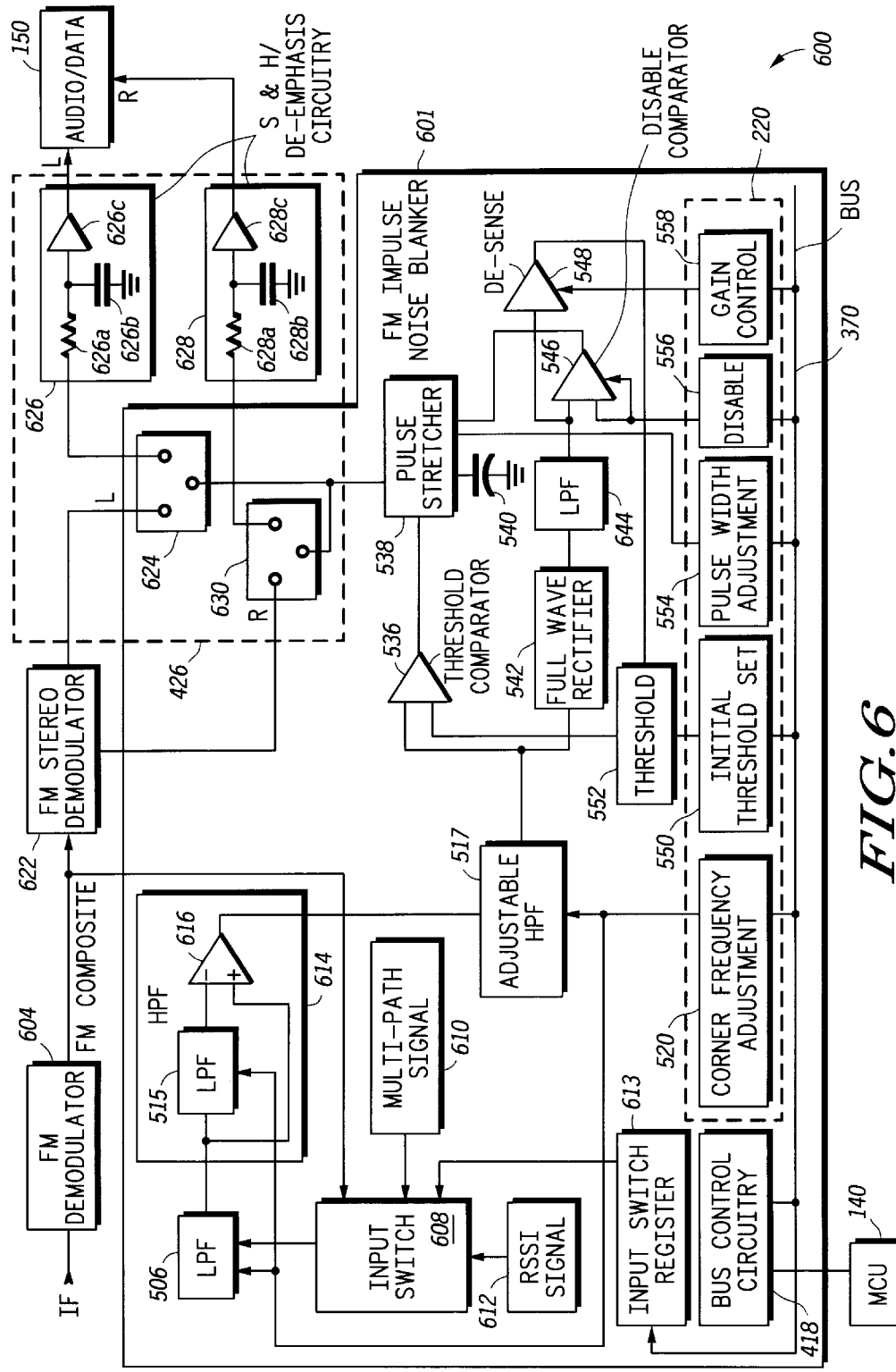
FIG. 6 is a system diagram illustrating one specific embodiment of a signal optimization circuitry built in accordance with FIG. 2 that contains a frequency modulation (FM) impulse noise blanker.

FIG. 6 is a system diagram illustrating one specific embodiment of a signal optimization circuitry 600 built in accordance with FIG. 2 that contains a frequency modulation (FM) impulse noise blanker 601. In certain embodiments of the invention, the signal optimization circuitry 600 of FIG. 6 is the signal optimization circuitry 230 of FIG. 2. The FM composite signal passes to an FM stereo demodulator 622. The demodulated signals from the FM stereo demodulator 622are received by sample and hold/de-emphasis circuitry 426 to thereby produce the plurality of audio/data output information 150.

The FM composite signal also passes to an input switch 608 which responds to an RSSI signal 612, a multi-path signal 610, and an output from an input switch register 613. The output of the input switch 608 passes to the adjustable low pass filter 506 which then outputs the signal to an adjustable high pass filter 614. The adjustable high pass filter 614 is actually the low pass filter 515 output subtracted from the original signal via summing amplifier 616. The high pass filter 614 passes a signal to the adjustable HPF 517. The adjustable HPF 517 receives adjustment signals from the corner frequency adjustment circuit 520 according to instructions from the MCU 140 across the bus 370. The bus control circuitry 418 programs the filter response of 517, 614, and 506. The output of the adjustable HPF 517 is coupled to a threshold comparator 536 and a full wave rectifier 542. The threshold comparator 536 also receives a threshold 552 output that has been determined according to the initial threshold set 550 as instructed by the MCU 140 across the bus 370. The output of the threshold comparator 536 is coupled to the pulse stretcher 538 which has a capacitor 540 and receives inputs from the pulse width adjustment 554 and the disable comparator 546. The disable comparator 546 receives input from the disable indicator 556 as instructed by the MCU 140 across the bus 370.

The full wave rectifier 542 passes its output to a LPF 644 which then passes its output to the other input of the disable comparator 546 as well as to the de-sense circuit 548. The de-sense circuit 548 receives instructions from the gain control 558 and outputs a signal to the threshold 552.

The pulse stretcher 538 passes its output to the sample and hold de-emphasis circuitry 426. Depending on the arrangement of switches 624 and 630, the pulse stretcher 538 output passes either to an FM stereo demodulator 622 output or a reference level to the sample and hold de-emphasis circuitry 626 or 628. The sample and hold de-emphasis circuitry 626 includes a resistor 626a, a capacitor 626b, and an amplifier 626c. Likewise, the sample and hold de-emphasis circuitry 628 includes a resistor 628a, a capacitor 628b, and an amplifier 628c. These signals then produce the plurality of audio/data output information 150.

Of note, the plurality of control registers 220 in the case of the FM impulse noise blanker 601 include a corner frequency adjustment 520, an initial threshold set 550, a pulse width adjustment 554, a disable indicator 556, and a gain control 558.

Figure 7:
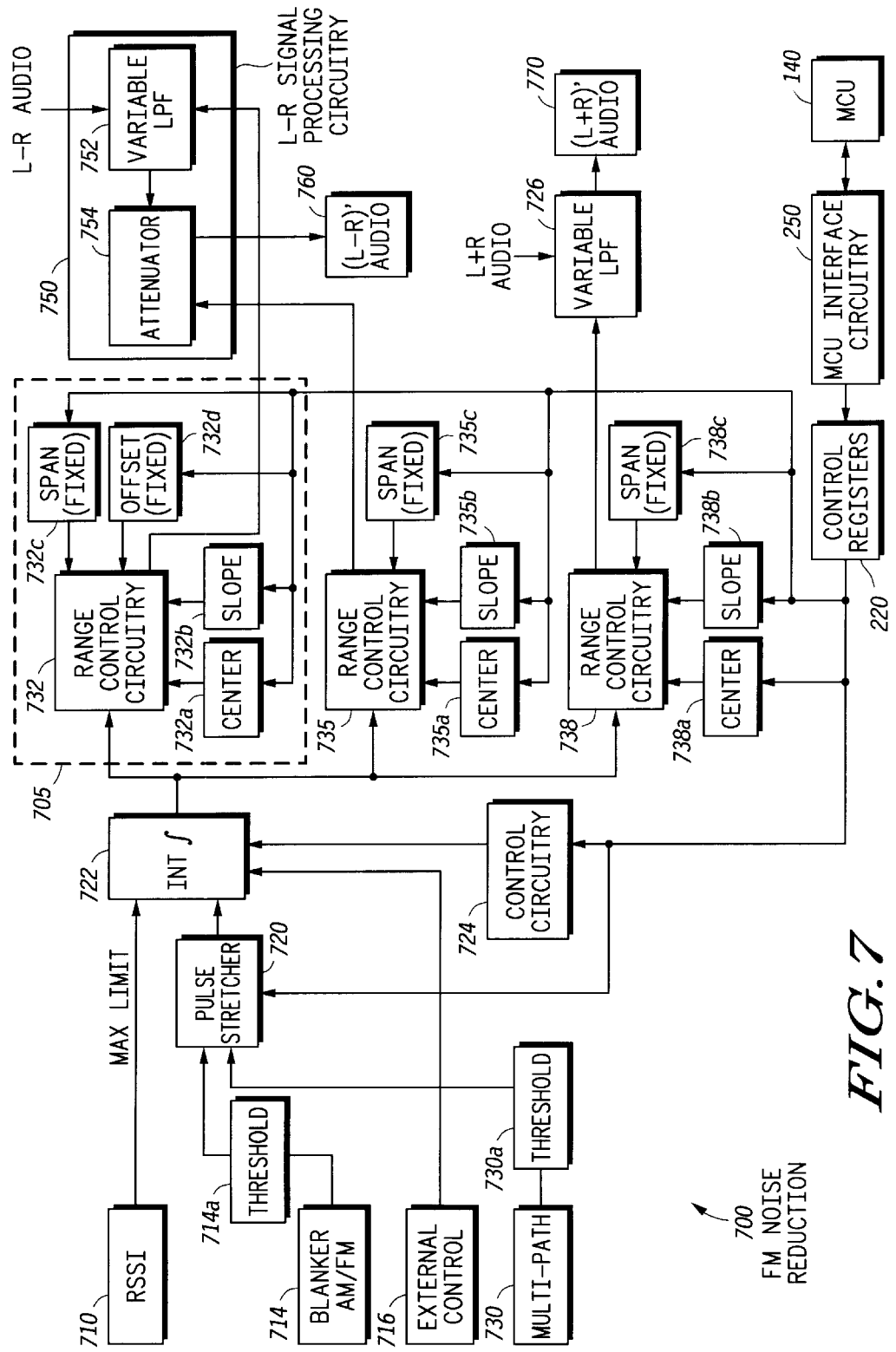
FIG. 7 is a system diagram illustrating one specific embodiment of a signal optimization circuitry built in accordance with FIG. 2 that is a frequency modulation (FM) noise reduction circuitry.

FIG. 7 is a system diagram illustrating one specific embodiment of a signal optimization circuit built in accordance with FIG. 2 that is a frequency modulation (FM) noise reduction circuitry 700. A number of signals are provided to the frequency modulation (FM) noise reduction circuitry 700. The number of signals includes, among other signals, a relative signal strength indication (RSSI) signal 710, a blanker AM/FM signal (BLANKER AM/FM) 714, an external control signal 716, and a multi-path signal 730. The blanker AM/FM signal (BLANKER AM/FM) 714 and the multi-path signal 730 are coupled to a pulse stretcher 720. The pulse stretcher 720 determines, among other things, the width of the pulses that are provided from the blanker AM/FM signal (BLANKER AM/FM) 714 and the multi-path signal 730. In certain embodiments of the invention, the blanker AM/FM signal (BLANKER AM/FM) 714 is coupled first through a threshold 714a before it is coupled to the pulse stretcher 720. Similarly, the multi-path signal 730 is coupled first through a threshold 730a before it is coupled to the pulse stretcher 720. After passing through the pulse stretcher 720 for modification as required, the blanker AM/FM signal (BLANKER AM/FM) 714 and the multi-path signal 730, after undergoing any required modification, are provided as an output signal to an integrator 722. The relative signal strength indication (RSSI) signal 710 also provides an output signal to the integrator 722. From certain perspectives, the integrator 722 is viewed as being a saturating integrator. Also, the external control signal 716 is provided to the integrator 722 in certain embodiments of the invention. In other embodiments of the invention, a control circuitry 724 further assists in the performance of the integration by the integrator 722.

The control circuitry 724 determines the various operational considerations of the integrator 722. Examples of such operational considerations include, among other things, the time constant of the integration performed by the integrator 722 and the amount of signal level augmentation per pulse, in conjunction with the maximum level signal provided by the relative signal strength indication (RSSI) signal 710. An output signal from the integrator 722 is provided, in parallel fashion, to a number of range control circuitries. Specifically, the output signal from the integrator 722 is provided to a range control circuitry 732, a range control circuitry 735, and a range control circuitry 738. The range control circuitry 732 is used to determine the bandwidth of a variable low pass filter (LPF) 752 contained within the left minus right (L–R) signal processing circuit 750. The left minus right (L–R) signal processing circuit 750 additionally contains, among other things, an attenuator 754, that is controlled using the range control circuitry 735.

The range control circuitry 732 uses a center parameter 732a and a slope parameter 732b and has a fixed span parameter 732c and a fixed offset parameter 732d to determine the bandwidth of the variable low pass filter (LPF) 752 contained within the left minus right (L–R) signal processing circuit 750. The center parameter 732a, as used in the description of the invention, is the mid-point of a selected portion of the integration range as determined by a specific control range circuitry (illustrated by the range control circuitry 732 in this embodiment) over which noise reduction is performed. The slope parameter 732b is related to the amount of change in the functional output in relation to the rate of change in the integrator 722. The span parameter 732c and the offset parameter 732d are fixed in this embodiment of the invention, and are utilized when the circuit is operating in the AM mode only. The functional definitions of similar parameters, having different reference numerals yet similar reference names in the various Figures, are operable without departing from the scope and spirit of the invention.

Similarly, the range control circuitry 735 uses a center parameter 735a, a slope parameter 735b, and a fixed span parameter 735c to determine the attenuation control of the attenuator 754 contained within the left minus right (L–R) signal processing circuitry 750. From other perspectives, the range control circuitry 732 controls the amount of any spectral modification that needs to be performed on a left minus right (L–R) audio signal using the variable low pass filter (LPF) 752 of the left minus right (L–R) signal processing circuitry 750. Similarly, the range control circuitry 735 controls the amount of any amplitude modification that needs to be performed on the left minus right (L–R) audio signal using the attenuator 754 of the left minus right (L–R) signal processing circuitry 750. The range control circuitry 732 and the range control circuitry 735 ensure proper frequency and scaling modification of the left minus right (L–R) audio signal. After performing any required low pass filtering and any required attenuation on the left minus right (L–R) audio signal, using the variable low pass filter (LPF) 752 and the attenuator 754, the left minus right (L–R) signal processing circuitry 750 outputs a modified left minus right (L–R)' audio signal 760

The range control circuitry 738 uses a center parameter 738a, a slope parameter 738b, and a fixed span parameter 738c to determine the bandwidth of a variable low pass filter (LPF) 726. The variable low pass filter (LPF) 726 receives a left plus right (L+R) audio signal and performs any required low pass filtering, as determined by the range control circuitry 738. After performing any low pass filtering required on the left plus right (L+R) audio signal, using the variable low pass filter (LPF) 726, a modified left plus right (L+R) audio signal 770 is provided.

In certain embodiments of the invention, several portions of the circuitry included within the frequency modulation (FM) noise reduction circuitry 700 are recycled and used in other operations within the invention. That is to say, certain portions of the circuitry involved in the invention are used, at different times and in different capacities, to perform various functions. This ability to re-use many of the portions of the hardware required to implement the invention provides a substantially reduced requirement of silicon real estate to implement the various functions of the invention. For example, the range control circuitry 732 that uses the center parameter 732a, the slope parameter 732b, the fixed span parameter 732c, and the fixed offset parameter 732d that is used in the frequency modulation (FM) noise reduction circuitry 700 is a common portion of hardware 705 that is used in other embodiments of the invention. For example, as is shown below in the detailed description of FIG. 8, the common portion of hardware 705 shown in FIG. 7, is usable in the embodiment of the invention shown below in FIG. 8.

Figure 8:
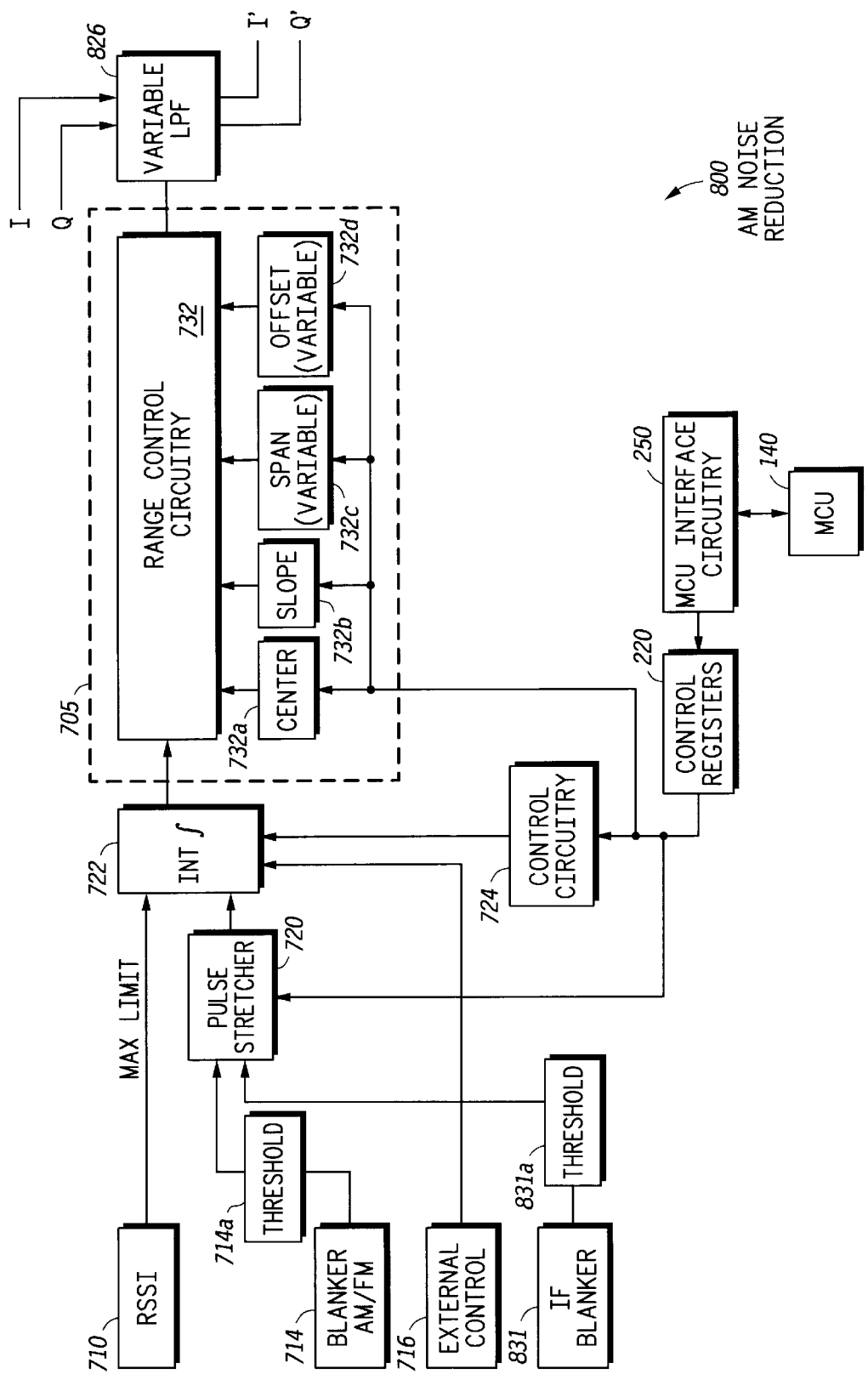
FIG. 8 is a system diagram illustrating one specific embodiment of a signal optimization circuitry built in accordance with FIG. 2 that is an amplitude modulation (AM) noise reduction circuitry.

FIG. 8 is a system diagram illustrating one specific embodiment of a signal optimization circuitry built in accordance with FIG. 2 that is an amplitude modulation (AM) noise reduction circuit 800. A number of signals are provided to the amplitude modulation (AM) noise reduction circuit 800. The various signals provided to the amplitude modulation (AM) noise reduction circuit 800 include, among other things, a relative signal strength indication (RSSI) signal 710, a blanker AM/FM signal (BLANKER AUDIO/FM) 714, an external control signal 716, and an intermediate frequency (IF) blanker signal 831. The blanker AM/FM signal (BLANKER AUDIO/FM) 714 and the intermediate frequency (IF) blanker signal 831 are provided to a pulse stretcher 720. The pulse stretcher 720 determines, among other things, the width of the pulses that are provided from the blanker AM/FM signal (BLANKER AM/FM) 714 and the intermediate frequency (IF) blanker signal 831. In certain embodiments of the invention, the blanker AM/FM signal (BLANKER AM/FM) 714 is coupled first through a threshold detector 714a before it is coupled to the pulse stretcher 720. Similarly, the intermediate frequency (IF) blanker signal 831 is coupled first through a threshold detector 831a before it is coupled to the pulse stretcher 720.

After passing through the pulse stretcher 720 for modification as required, the blanker AM/FM signal (BLANKER AM/FM) 714 and the intermediate frequency (IF) blanker signal 831, after undergoing any required modification, are provided as an output signal to an integrator 722.

The relative signal strength indication (RSSI) signal 710 provides an output signal to the integrator 722. The relative signal strength indication (RSSI) signal 710 determines the maximum level that the integrator 722 will achieve. From certain perspectives, the integrator 722 is viewed as being a saturating integrator. Also, the external control signal 716 is provided to the integrator 722 in certain embodiments of the invention. This control allows for the integrator 722 to be forced to a particular signal level. In other embodiments of the invention, a control circuitry 724 further assists in the performance of the integration by the integrator 722.

The control circuitry 724 determines the various operational considerations of the integrator 722. Examples of such operational considerations include, among other things, the time constant of the integration performed by the integrator 722 and the amount of signal level augmentation per pulse of the pulse stretcher 720, in conjunction with the maximum level signal provided by the relative signal strength indication (RSSI) signal 710. An output signal from the integrator 722 is provided, in parallel fashion, to a range control circuit 732. The range control circuitry 732 is used to determine the bandwidth of a variable low pass filter (LPF) 826. The range control circuitry 732 uses a center parameter 732a, a slope parameter 732b, a span parameter 732c, and a variable offset parameter 732d to determine the bandwidth of the variable low pass filter (LPF) 826 for a given signal level on the integrator 722. The variable low pass filter (LPF) 826 receives an amplitude modulation signal having both an in-phase and a quadrature component. After performing any required low pass filtering using the variable low pass filter (LPF) 826, a modified amplitude modulation signal having both a modified in-phase and a modified quadrature component is provided.

As described above and similar with respect to FIG. 7, in certain embodiments of the invention, several portions of the circuitry included within the amplitude modulation (AM) noise reduction circuitry 800 are recycled and used in other operations within the invention. For example, the range control circuitry 732 that uses the center parameter 832a, the slope parameter 732b, the span parameter 832c, and the variable offset parameter 732d that is used in the amplitude modulation (AM) noise reduction circuitry 800 is a common portion of hardware 705 that is used in other embodiments of the invention. For example, as is shown above in the detailed description of FIG. 7, the common portion of hardware 705 shown in FIG. 8, is usable in the embodiment of the invention shown above in FIG. 8.

Figure 9:
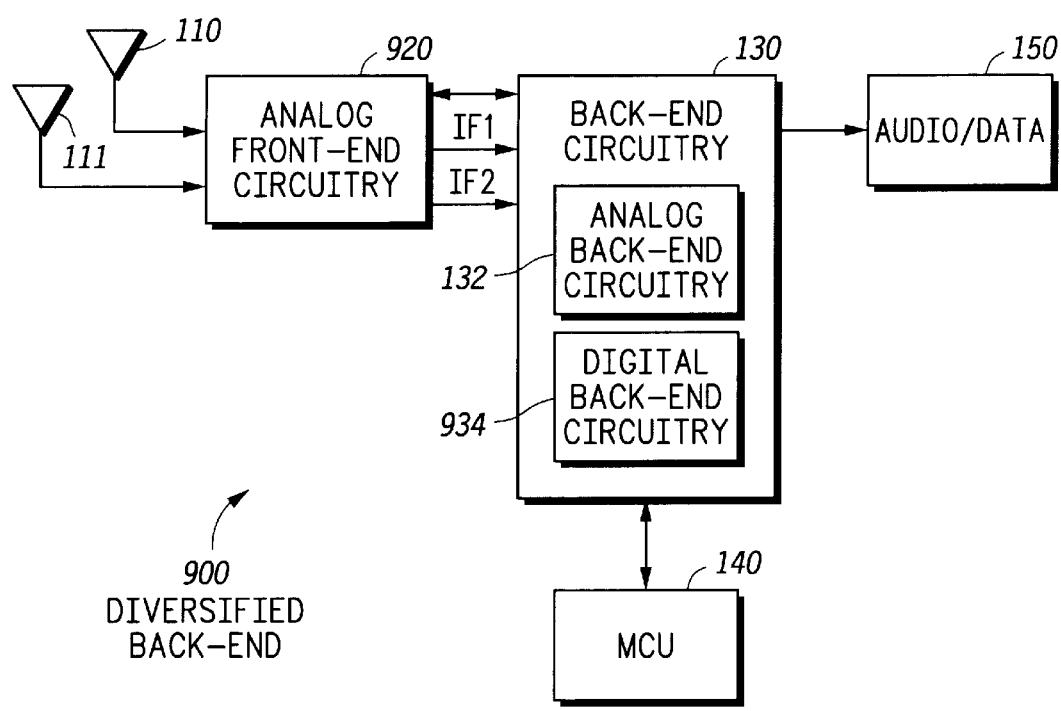
FIG. 9 is a system diagram illustrating one embodiment of a back-end circuitry built in accordance with the radio of FIG. 1 having both analog and digital circuitry.

FIG. 9 is a system diagram illustrating one embodiment of a radio 900 built in accordance with the radio of FIG. 1 having a back-end circuitry 130 containing both an analog back-end circuitry 132 and a digital back-end circuitry 934. The radio 900 receives a signal using an antenna 110. In certain embodiments of the invention, the radio 900 contains an additional antenna 111. The radio itself contains, among other things, an analog front-end circuit 920, the back-end circuit 130, and a micro-controller (MCU) 140 that is communicatively coupled to the back-end circuit 130. The back-end circuitry 130 and the analog front-end circuitry 920 are communicatively coupled to convey, among other things, control commands between the back-end circuitry 130 and the analog front-end circuitry 920. The control commands are provided to the radio 900 from the micro-controller (MCU) 140 to the back-end circuitry 130. As described above, the back-end circuitry 130 itself contains, among other things, the analog back-end circuitry 132 and the digital back-end circuit 934. In addition, the back-end circuitry 130 receives a first intermediate frequency signal (IF1) and a second intermediate frequency signal (IF2) from the analog front-end circuit 920. In certain embodiments of the invention, the first intermediate frequency signal (IF1) is provided to the analog back-end circuitry 132, and the second intermediate frequency signal (IF2) is provided to the digital back-end circuitry 934. The back-end circuit 130 of the radio 900 provides a plurality of audio/data output information 150.

In certain embodiments of the invention, the antenna 110 is connected to the analog front end-circuitry 290 to produce the signal at the first intermediate frequency signal (IF1). The antenna 111 is connected to the analog front end-circuitry 920 to produce a signal at the second intermediate frequency signal (IF2). The scope of this invention includes the switching of the antenna 110 and the antenna 111 in a manner such that the signal from the antenna 110 is procesed and supplied as the second intermediate frequency signal (IF2) and the signal of the antenna 111 is processed and supplied as the first intermediate frequency signal (IF1) output.

The first intermediate frequency signal (IF1) is operable with the analog back-end circuitry 132, in various embodiments of the invention, to provide a certain audio or data type for the plurality of audio/data output information 150. Similarly, the second intermediate frequency signal (IF2) is operable with the digital back-end circuitry 934, in various embodiments of the invention, to provide a certain audio or data type for the plurality of audio/data output information 150. If desired, the second intermediate frequency signal (IF2) is provided to the analog back-end circuitry 132, and the first intermediate frequency signal (IF1) is provided to the digital back-end circuitry 934 without departing from the scope and spirit of the invention. Any number of audio/data types is provided from the back-end circuitry 130 in various embodiments of the invention. From certain perspectives, the implementation of the first intermediate frequency signal (IF1) and a second intermediate frequency signal (IF2) are used to provide multiple audio and data types for the plurality of audio/data output information 150 simultaneously. The plurality of audio/data output information 150 is provided to speakers for audible reproduction of the signal that is received using the antenna 110 in a form that is substantially perceptually indistinguishable from the signal being encoded and transmitted before it is received using the antenna 110.

In certain embodiments of the invention, the antenna 110 of FIG. 9 is the antenna 110 of FIG. 1. Similarly, the back-end circuitry 130 of FIG. 9 is the back-end circuitry 130 of FIG. 1 having the embedded analog back-end circuitry 132. Moreover, the plurality of audio/data output information 150 of FIG. 9 is similarly the plurality of audio/data output information 150 of FIG. 1.

The radio 900 is operable to switch between the analog back-end circuitry 132 and the digital back-end circuitry 934 of the back-end circuitry 130 in real time. For example, in certain embodiments of the invention, the digital back-end circuitry 934 is used to provide the plurality of audio/data output information 150 that is extracted from the signal that is received from the antenna 110 while the analog back-end circuitry 132 continues to search for another signal of a substantially superior quality than that signal that is presently being received using the antenna 110. Alternatively, the analog back-end circuitry 132 is used to provide the plurality of audio/data output information 150 that is extracted from the signal that is received from the antenna 110 while the digital back-end circuitry 934 continues to search for another signal of a substantially superior quality than that signal that is presently being received using the antenna 110.

This configuration of having both the analog back-end circuitry 132 and the digital back-end circuitry 934 operable in real time provides the opportunity to provide uninterrupted operation to the user of the radio 900 while always ensuring a substantially high quality reproduction of the signal that is received by the antenna 110 of the radio 900.

Although the invention has been described with respect to specific conductivity types or polarity of potentials, skilled artisans appreciated that conductivity types and polarities of potentials may be reversed.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A radio back-end integrated circuit, comprising:
    a blanking switch having a signal input which receives an IF signal, a control input, and a signal output;
    a demodulator having an input coupled to the output of the blanking switch, and an output;
    a sample and hold switch having a signal input coupled to the output of the demodulator, a control input, and an output;
    a noise impulse detector having an input coupled to the IF signal and an output coupled to the control inputs of the blanking switch and the sample and hold switch;
    a sample and hold/de-emphasis circuit having an input coupled to the output of the sample and hold switch, and an output, wherein the sample and hold/de-emphasis circuit comprises a high input impedance amplifier, a resistor, and only one capacitor.

2. The radio back-end circuit of claim 1, wherein:
    the resistor has a first terminal directly connected to the sample and hold switch, and a second terminal;
    the only capacitor of the sample and hold/de-emphasis circuit has a first terminal coupled to the second terminal of the resistor, and a second terminal coupled to a reference terminal; and
    the amplifier has an input coupled to the second terminal of the resistor, and an output.

3. The radio back-end circuit of claim 2, further comprising a pulse stretcher coupled between the output of the noise impulse detector and the control input of the sample and hold switch.

4. An AM/FM radio back-end circuit, comprising:
    an AM signal processing circuit which receives an AM IF signal, provides a corresponding demodulated output, and has a blanking input;
    an FM signal processing circuit which receives an FM IF signal, provides a corresponding demodulated output, and has a blanking input; and
    an impulse noise detector coupled to the AM demodulator and the FM demodulator having an output coupled to the blanking inputs of the AM and FM demodulators.

5. The AM/FM radio back-end circuit of claim 4 wherein the noise impulse detector comprises:
    an AM envelope detector and band pass filter having an input for receiving the AM IF signal, and an output;
    a band pass filter having an input coupled to the output of the FM signal processing circuit, and an output;
    an impulse detector having a first input coupled to the output of the band pass filter, a second input coupled to the output of the AM envelope detector and band pass filter; and an output coupled to the blanking inputs of the AM s signal processing circuit and the FM signal processing circuit.

6. An AM/FM radio back-end circuit, comprising:
    an AM signal processing circuit which has a signal input for receiving an AM IF signal, a blanking input, and an output which provides a demodulated output;
    an FM demodulator which has an input for receiving an FM IF signal and an output for providing a composite FM signal;
    an FM signal processing circuit having a signal input coupled to the output of the FM demodulator, a blanking input, and an output;
    an AM envelope detector and band pass filter having an input for receiving the AM IF signal and an output which provides an AM envelope signal;
    an input switch having a first signal input for receiving the composite FM signal, a second signal input for receiving a multi-path signal, a third signal input for receiving a RSSI signal, a control input for receiving a switch control signal, and an output;

a band pass filter having an input coupled to the output of the input switch, and an output;

an impulse detector having a first input coupled to the output of the band pass filter, a second input coupled to the output of the AM envelope detector and band pass filter; and an output coupled to the blanking inputs of the AM signal processing circuit and the FM signal processing circuit.

7. The AM/FM radio back-end circuit of claim 6, wherein the band pass and envelope detection circuit comprise a first low pass filter, and a second low pass filter, and a vector root mean square circuit.

8. The AM/FM radio back-end circuit of claim 7, wherein the band pass filter comprises the first and second low pass filter.

9. The AM/FM radio back-end circuit of claim 8, wherein the first and second low pass filters are adjustable in response to a digital control signal.

10. A radio back-end circuit, comprising:

a signal processing circuit which receives an IF signal, provides a corresponding demodulated output, and has a blanking input; and an impulse noise detector for receiving the IF signal, providing a pulse at a selected width to the blanking input in response to detecting a noise impulse, wherein the width of the pulse is selected in response to digital signals provided external to the radio back-end circuit;

wherein the impulse noise detector disables pulse generation if average noise voltage exceeds a threshold, wherein the threshold is selected in response to digital signals.

11. In a radio back-end circuit, a method for generating a blanking pulse comprising the steps of:

converting an IF signal to two quadrature-related baseband components;

low pass filtering the two base band components at a corner frequency selected in response to digital input signals;

finding the root mean square of the low passed components to provide an envelope signal;

detecting an impulse on the envelope signal; and generating the blanking pulse in response to detecting the impulse.

12. An AM/FM radio back-end circuit, comprising:

an AM signal processing circuit which receives an AM IF signal and provides a corresponding demodulated output;

an FM signal processing circuit which receives an FM IF signal and provides a corresponding demodulated output; and an impulse noise detector, coupled to the AM signal processing circuit and the FM signal processing circuit, having a plurality of filters, wherein the plurality of filters are used for detecting noise impulses present on the FM IF signal and the AM IF signal.

* * * * *